United States Patent [19]
Lee

[11] Patent Number: 5,327,128
[45] Date of Patent: Jul. 5, 1994

[54] COMPACT GLITCHLESS M OF N DECODER CIRCUIT FOR DIGITAL TO ANALOG CONVERTERS

[75] Inventor: Man S. Lee, San Mateo, Calif.

[73] Assignee: Cirrus Logic, Inc., Fremont, Calif.

[21] Appl. No.: 7,893

[22] Filed: Jan. 22, 1993

[51] Int. Cl.[5] ............................................. H03M 7/20
[52] U.S. Cl. ................................................... 341/102
[58] Field of Search ............... 341/102, 136, 144, 154; 307/449, 450, 463

[56] References Cited

U.S. PATENT DOCUMENTS 4,584,567 4/1986 Kinghorn .............................. 341/95
4,633,220 12/1986 Burgess ................................ 341/136

Primary Examiner—Brian K. Young

[57] ABSTRACT

An M of N decoder circuit includes N output terminals, $\log_2(n+1)$ logic input terminals, two voltage input terminals, and $(N+1)\log_2(N+1)$ pass transistors, each having a gate connected to one of the logic input terminals, a source connected to one of a voltage input terminal and an output terminal, and a drain connected to one of said output terminals, each of the pass transistors for passing a voltage signal from source to drain when the gate has applied to it one logic level and for not passing said voltage signal when the gate has applied to a different logic level. More particularly, half of the pass transistors are of one conduction type and half of the pass transistors are of an opposite conduction type. The gates of $N+1$ pass transistors are connected to each of the $\log_2(M+1)$ input terminals. For $i = 0$ to $\log_2(N+1)-1$, pass transistors of one conduction type whose gates are connected to an i-th input terminal are connected in groups of $2^i$, and pass transistors of the opposite conduction type whose gates are connect to the i-th input terminal are also connected in groups of $2^i$.

6 Claims, 2 Drawing Sheets

COMPACT GLITCHLESS M OF N DECODER CIRCUIT FOR DIGITAL TO ANALOG CONVERTERS

BACKGROUND OF THE INVENTION

1. Field of the Invention

The present invention relates to decoder circuits for digital to analog converters and more particularly to a compact glichless M of N decoder circuit.

2. State of the Art

Digital to analog converters are well-known. In one type of digital to analog converter, digital input signals are used to control current sources to produce a precisely controlled current at a circuit node. The precisely controlled current is caused to flow through a resistor to produce an analog voltage. A decoder circuit is required to turn on and off the appropriate current sources based on the digital inputs. Desirable characteristics of such a decoder circuit are that it be compact, glichless in the sense of causing the current sources to turn on in a desired predictable order, and easily scaleable in order to realize digital to analog converters of different resolutions. The present invention exhibits each of the foregoing characteristics.

SUMMARY OF THE INVENTION

According to the present invention, a decoder circuit is formed of a regular array of pass transistors, the array having a first number of logical rows and a second number of logical columns. In one embodiment, approximately half of the pass transistors are of one conduction type and approximately half of the pass transistors are of another conduction type. In another embodiment, all of the pass transistors may be of the same conduction type. In accordance with the former embodiment, a first number of logic input terminals are provided, each respective one being connected to gate electrodes of each pass transistor in a respective one of the rows. Also provided is a number of output terminals, not greater than the number of logical columns, each of which is connected to drain electrodes of each pass transistor in a respective one of the columns. An ON voltage input terminal is connected to source electrodes of selected ones of the pass transistors, and an OFF voltage input terminal is connected to source electrodes of selected other ones of the pass transistors. Remaining source electrodes are connected to respective ones of the output terminals.

More particularly, an M of N decoder circuit includes N output terminals, $\log_2(N+1)$ logic input terminals, two voltage input terminals, and $(N+1)\log_2(N+1)$ pass transistor means, each having a gate connected to one of the logic input terminals, a source connected to one of a voltage input terminal and an output terminal, and a drain connected to one of said output terminals, each of the pass transistor means for passing a voltage signal from source to drain when the gate has applied to it one logic level and for not passing said voltage signal when the gate has applied to it a different logic level. Half of the pass transistor means are of one conduction type and half of the pass transistor means are of an opposite conduction type. The gates of $N+1$ pass transistor means are connected to each of the $\log_2(N+1)$ input terminals. For $i=0$ to $\log_2(N+1)-1$, pass transistor means of one conduction type whose gates are connected to an i-th input terminal are connected in groups of $2^i$, and pass transistor means of the opposite conduction type whose gates are connected to the i-th input terminal are also connected in groups of $2^i$.

In accordance with the embodiment in which all of the pass transistors are of the same conduction type, complement logic input terminals are provided. Pass transistors that in the previous embodiment would have been of one conduction type are connected to one of the true and complement logic input terminals in respective rows. Pass transistors that in the previous embodiment would have been of an opposite conduction type are connected to the other one of the true and complement logic input terminals.

BRIEF DESCRIPTION OF THE DRAWINGS

The present invention can be further understood with reference to the following description in conjunction with the appended drawings. In the drawings.

DETAILED DESCRIPTION OF THE PREFERRED EMBODIMENTS

Figure 1:
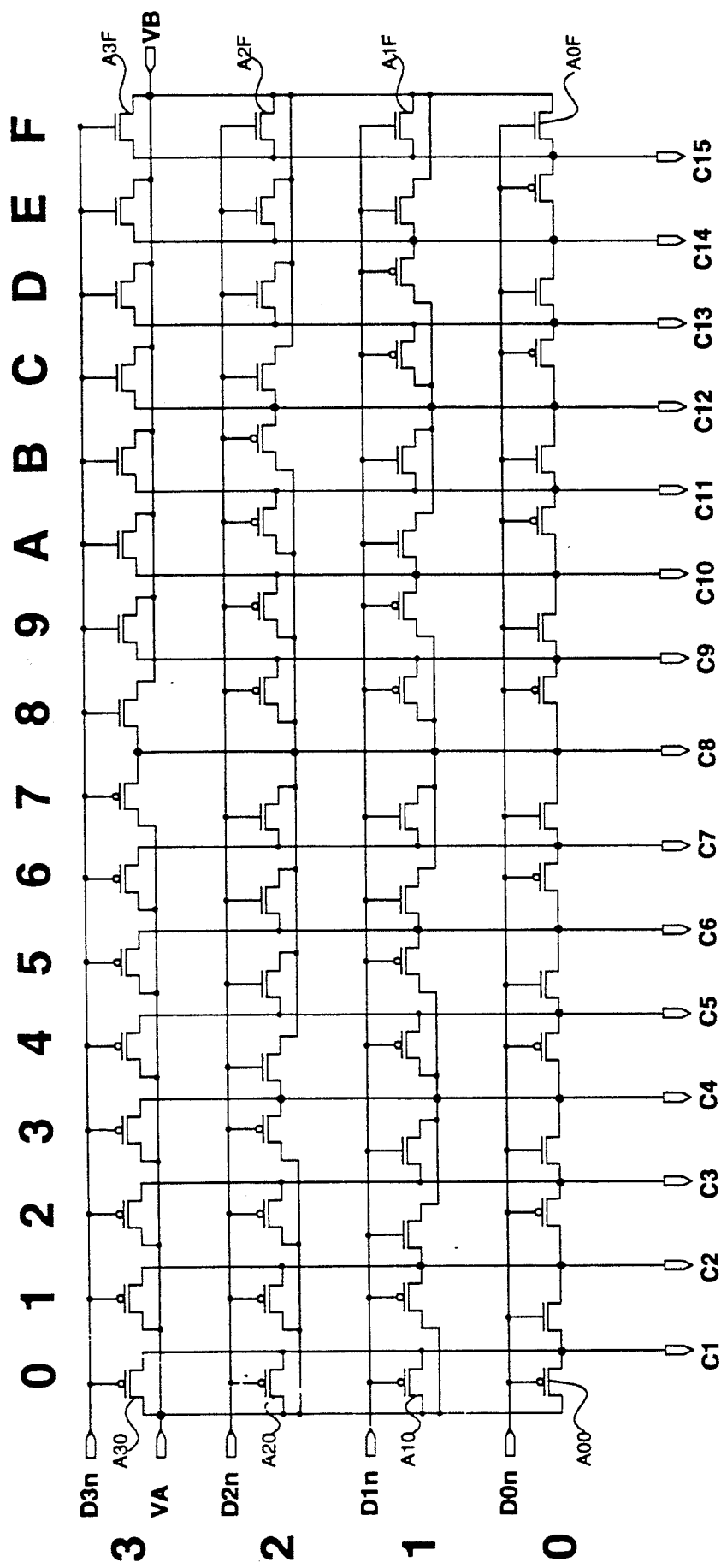
FIG. 1 is a schematic diagram one embodiment of the decoder circuit of the present invention.

Referring to FIG. 1, an M of N decoder circuit receives a digital value on logic input terminals D0n to D3n and produces a unique output signal on output terminals C1–C15 for each digital value. Unlike conventional 1 of N decoders, more than one output signal may be active at the same time. Also unlike a conventional decoder, the output signals need not be strictly logic level signals. Rather, an "on" voltage VA supplied at a voltage input terminal VA is produced when an output signal is active, and an "off" voltage VB supplied at a voltage input terminal VB is produced when an output signal is inactive. The decoder circuit may be used in a digital to analog converter, in which case the output signals C1–C15 are connected to the gates of respective current sources. Although in FIG. 1 N=15, N may be a greater or lesser number as will be apparent to one of ordinary skill in the art.

The decoder circuit is formed of a regular array of pass transistors. For N=15, the pass transistors are arranged in four rows and 16 columns. For purposes of present description, the rows are designated by numbers 0–3 and the columns are designated 0–F in accordance with hexadecimal notation. A particular pass transistor is designated by A followed by first the row number, then the column number. For example, the first pass transistor from the left in first row from the bottom is designated "A00". The first and last pass transistors of each row have been labeled with their respective designations.

Each of the pass transistor rows includes half N-type transistors and half P-type transistors. The gates of all of the pass transistors in a given row are connected to a corresponding logic input terminal. For example, the gates of all of the pass transistors in row 0 are connected to the logic input terminal D0n. Although every row has the same number of pass transistors of each type, the arrangement of the pass transistors within the row varies from row to row. In row 0, for example, N and P pass transistors alternate. In row 1, N and P transistors are grouped in pairs, in row 2 they form groups of 4, and in row 3 they form groups of 8.

The source and drain connections of the pass transistors also varies between rows. In row 0 for example, the source of pass transistor A00 is connected to voltage VA, and the source of pass transistor A0F is connected to voltage VB. The remaining pass transistors in row 0, however, are connected between adjacent output terminals. In row 3, by contrast, although the drains of each of the transistors are connected to the same output terminals as corresponding pass transistors in row 0, the sources of pass transistors A30-A37 in row 3 are all connected to voltage VA, and the sources of pass transistors A38-A3F in row 3 are all connected to voltage VB. In row 2, the sources of pass transistors A20-A23 are connected to voltage VA, the sources of pass transistors A24-A2B are connected to output terminal C8, and the sources of pass transistors A2C-A2F are connected to voltage VB. The pass transistors of row 1 are connected in a still different fashion, sources being connected to either a voltage input terminal or an output terminal and drains being connected to an output terminal.

In operation, when the logic inputs D0n-D3n represent binary 0, the voltage VA is produced at each of the output terminals C1-C15. When the logic inputs represent a binary 1, output terminals C1-C14 are on and carry the voltage VA, whereas output terminal C15 is off and carries the voltage VB. When the logic inputs represent a binary 2, the output terminals C1-C13 are on and the output terminals C14 and C15 are off, and so forth.

Operation of the decoder circuit may be better appreciated from several concrete examples. Take for example the case where the logic inputs are all 0. In row 3, pass transistors A30-A37 are turned on, conducting the voltage VA to output terminals C1-C8. In row 2, pass transistors A28-A2B are turned on, conducting the voltage VA from output terminal C8 to output terminals C9-C12. In row 1, pass transistors A1C and A1D are turned on, conducting the voltage VA from output terminal C12 to output terminals C13 and C14. Finally, in row 0, pass transistor A0E is turned on, conducting the voltage VA from output terminal C15.

In the case where logic input D2n is 1 and the rest of the logic inputs are 0, pass transistors A30-A37 are again turned on, conducting the voltage VA to output terminals C1-C8. In row 2, pass transistors A2C-A2F are turned on, conducting the voltage VB to output terminals C12-C15. In row 1, pass transistors A18 and A19 are turned on, conducting the voltage VA from output terminal C8 to output terminals C9 and C10. Finally, in row 0, pass transistor A0A is turned on, conducting the voltage VA from output terminal C10 to output terminal C11.

As a final example, take the case where the logic inputs are 1010. In row 3, pass transistors A38-A3F are turned on, connecting the voltage VB to output terminals C8-C15. In row 2, pass transistors A20-A23 are turned on, conducting the voltage VA to output terminals C1-C4. In row 1, pass transistors A16 and A17 are turned on, conducting the voltage VB from output terminal C8 to output terminals C7 and C6. Finally, in row 0, pass transistor A04 is turned on, conducting the voltage VA from output terminal C4 to output terminal C5.

The decoder circuit as described above offers important advantages in comparison with conventional decoder circuits. The voltages VA and VB need not be logic level voltages but may be set anywhere within a range of voltages, allowing for biasing of a digital to analog converter. The decoder circuit is very compact, requiring only $(N+1)\log_2(N+1)$ gates as compared to a much greater number of gates for a conventional decoder circuit. The decoder circuit is also glichless in that the output terminals transition from off to on in a predictable desired order. For example, if the logic inputs change from all ones to all zeros, causing all of the output signals to change from off to on, none of the output terminals C2-C15 will become active earlier than the output terminal C1, none of the output terminals C3-C15 will become active earlier than output terminal C2, and so forth. Finally, the decoder circuit is easily scaleable in order to realize digital to analog converters of different resolutions.

For example, to realize an M of 31 decoder circuit, 16 additional columns of transistors would be added to the circuit of the Figure, together with an additional row of 32 transistors controlled in accordance with a data signal D4n. The transistor types would be determined such that, as in the circuit of the Figure, equal numbers of P and N type transistors populate each row but in groups of decreasing powers of two, beginning with the topmost row.

Figure 2:
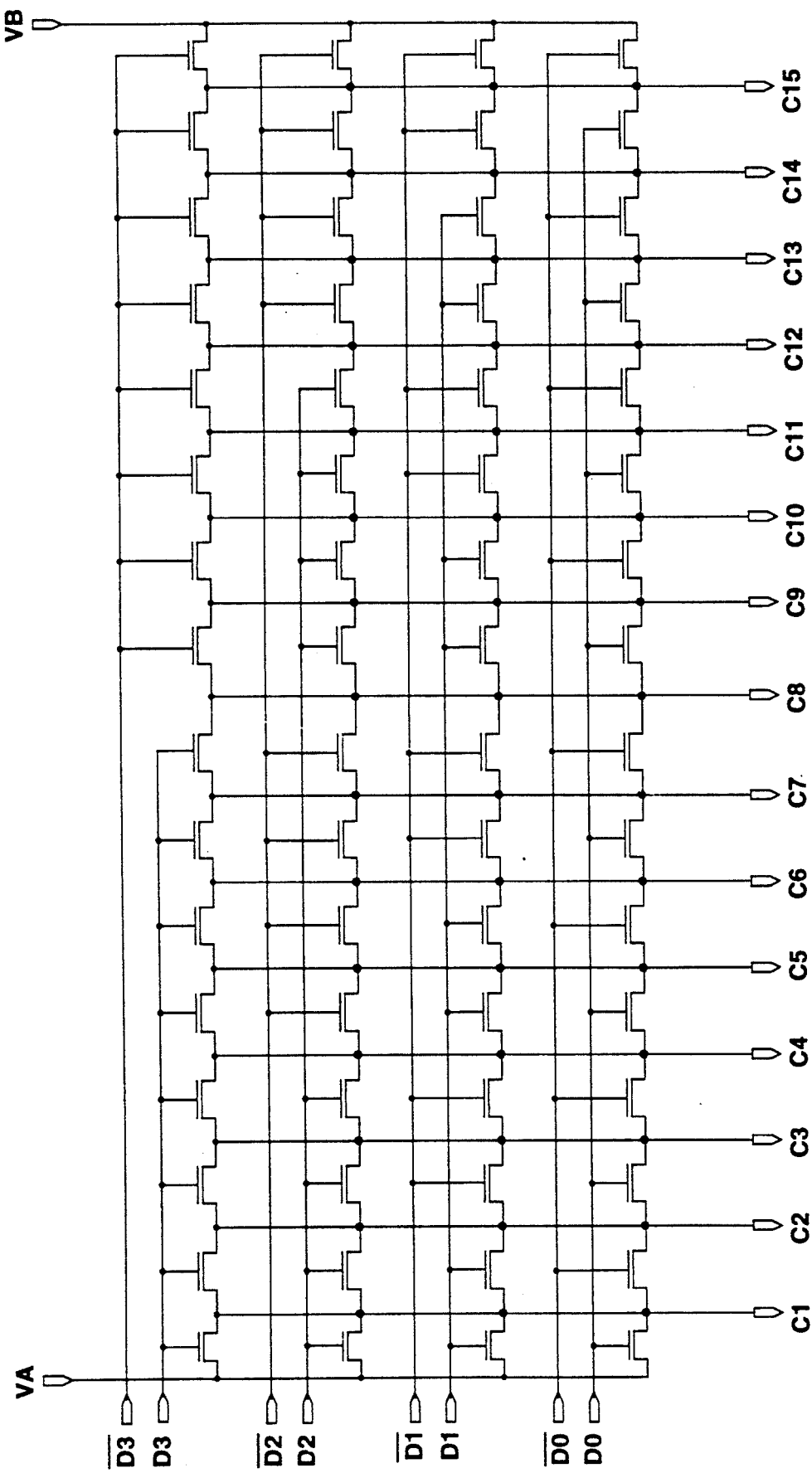
FIG. 2 is a schematic diagram of another embodiment of the present invention.

In another embodiment, shown in FIG. 2, all of the pass transistors are of the same conduction type (in this case, N-type). However, complement logic input terminals D0/D0, D1/D1, D2/D2 and D3/D3 are provided. Pass transistors that in the previous embodiment would have been N-type are connected to the true logic input terminals D0, D1, D2, D3 in the respective rows. Pass transistors that in the previous embodiment would have been P-type are connected to the complement logic input terminals D0, D1, D2, D3 in the respective rows. This embodiment has the advantage that only pass transistors of a single conduction type need to be formed, an advantage in some situations.

The foregoing has described the principles, preferred embodiments and modes of operation of the present invention. However, the invention should not be construed as limited to the particular embodiments discussed. The above-described embodiments should therefore be described as illustrative rather than restrictive. Variations may be made in those embodiments without departing from the scope of the present invention as defined by the following claims.

What is claimed is:

1. An M-of-N decoder circuit comprising:
   N output terminals;
   $\log_2(N+1)$ logic input terminals; and
   $(N+1)\log_2(N+1)$ pass transistor means each having a gate connected to one of said logic input terminals, a source connected to one of a voltage input terminal and an output terminal, and a drain connected to one of said output terminals, each for passing a voltage signal from source to drain when the gate has applied to it one logic level and for not passing said voltage signal when the gate has applied to it a different logic level.

2. The apparatus of claim 1 wherein half of said pass transistor means are of one conductor type and half of said pass transistor means are of an opposite conduction type.

3. The apparatus of claim 2 wherein the gates of $N+1$ of said pass transistor means are connected to each of said $\log_2(N+1)$ input terminals.

4. The apparatus of claim 3 wherein for $i=0$ to $\log_2(N+1)-1$, pass transistor means of said one conduction type whose gates are connected to an i-th input terminal are connected in groups of $2^i$ and pass transistors of said opposite conduction type whose gates are connected to said i-th input terminal are also connected in groups of $2^i$.

5. A decoder circuit, comprising:
a regular array of pass transistors, said array having a first number of logical rows and a second number of logical columns, approximately half of said pass transistors being of one conduction type and approximately half of said pass transistors being of another conduction type;
logic input terminals of said first number, each respective one of which is connected to a gate electrode of each pass transistor in a respective one of said rows;
output terminals of a number not greater than said second number, each respective one of which is connected to drain electrodes of each pass transistor in a respective one of said columns; and
an ON voltage input terminal connected to source electrodes of selected ones of said pass transistors and an OFF voltage input terminal connected to source electrodes of selected other ones of said pass transistors, source electrodes of pass transistors other than said selected ones and selected other ones being connected to respective ones of said output terminals.

6. A decoder circuit, comprising:
a regular array of pass transistors, said array having a first number of logical rows and a second number of logical columns, said pass transistors being of one conduction type;
true and complement logic input terminal pairs of said first number, one logic input terminal of each respective logic input terminal pair being connected to a gate electrode of each pass transistor in a respective one of said rows;
output terminals of a number not greater than said second number, each respective one of which is connected to drain electrodes of each pass transistor in a respective one of said columns; and
an ON voltage input terminal connected to source electrodes of selected ones of said pass transistors and an OFF voltage input terminal connected to source electrodes of selected other ones of said pass transistors, source electrodes of pass transistors other than said selected ones and selected other ones being connected to respective ones of said output terminals.

* * * * *